United States Patent
Rosenberg et al.

(10) Patent No.: US 6,911,599 B2
(45) Date of Patent: Jun. 28, 2005

(54) HEADER ASSEMBLY FOR OPTOELECTRONIC DEVICES

(75) Inventors: Paul K. Rosenberg, Sunnyvale, CA (US); Giorgio Giaretta, Mountain View, CA (US); Stefano Schiaffino, Menlo Park, CA (US); James Stewart, San Jose, CA (US); Rudolf J. Hofmeister, Sunnyvale, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/795,597

(22) Filed: Mar. 8, 2004

(65) Prior Publication Data

US 2004/0168819 A1 Sep. 2, 2004

Related U.S. Application Data

(63) Continuation of application No. 10/231,395, filed on Aug. 29, 2002, now Pat. No. 6,703,561, which is a continuation-in-part of application No. 10/077,067, filed on Feb. 14, 2002, now Pat. No. 6,586,678, and a continuation-in-part of application No. 10/101,260, filed on Mar. 18, 1992.
(60) Provisional application No. 60/317,835, filed on Sep. 6, 2001.

(51) Int. Cl.[7] .............................................. H01L 23/02
(52) U.S. Cl. ...................... 174/52.5; 174/52.1; 361/714; 361/717
(58) Field of Search .............................. 174/52.1, 52.5, 174/16.3; 361/714, 717; 257/732, 733, 712, 713

(56) References Cited

U.S. PATENT DOCUMENTS

| | | | |
|---|---|---|---|
| 3,987,676 A | 10/1976 | Bennewitz | |
| 4,128,697 A | 12/1978 | Simpson | |
| 4,375,578 A | 3/1983 | Mitchell et al. | |
| 4,769,684 A | * 9/1988 | Crocker et al. | ................ 257/99 |
| 5,212,345 A | * 5/1993 | Gutierrez | .................... 174/52.5 |
| 5,545,846 A | * 8/1996 | Williams et al. | ............... 17/451 |
| 6,586,678 B1 | 7/2003 | Rosenberg et al. | |
| 6,703,561 B1 | 3/2004 | Rosenberg et al. | |

OTHER PUBLICATIONS

Murata, S., Nishimura, K., *Improvement in Thermal Properties of a Multi–Beam Laser Diode Array*, Japanese Journal of Applied Physics, vol. 28, Suppl. 28–3, pp. 165–170 (1989).

\* cited by examiner

*Primary Examiner*—Hung V. Ngo
(74) *Attorney, Agent, or Firm*—Workman Nydegger

(57) ABSTRACT

A header assembly is provided that includes a base having a device side and a connector side. The header assembly further includes a platform attached to the base and positioned in a predetermined orientation with respect to the base. The device side of the base cooperates with a cap to define a hermetic chamber wherein one or more optoelectronic components, such as optical transmitters and optical receivers, are disposed. The platform includes an inside portion proximate the device side of the base and an outside portion proximate the connector side of the base, and the platform further includes at least one conductive pathway extending substantially through the platform so as to facilitate electrical communication between components disposed on the device side of the base, and circuits, devices and systems disposed on the connector side of the base.

42 Claims, 8 Drawing Sheets

HEADER ASSEMBLY FOR OPTOELECTRONIC DEVICES

CROSS-REFERENCE TO RELATED APPLICATIONS

This application is a continuation of U.S. patent application Ser. No. 10/231,395, filed Aug. 29, 2002 now U.S. Pat. No. 6,703,561, entitled "Header Assembly Having Integrated Cooling Device" which is a continuation-in-part of the following applications: U.S. patent application Ser. No. 10/077,067, filed Feb. 14, 2002, entitled "Ceramic Header Assembly" (now U.S. Pat. No. 6,586,678); and U.S. patent application Ser. No. 10/101,260, filed Mar. 18, 2002, (claiming priority to U.S. Provisional Patent Application Ser. No. 60/317,835, filed Sep. 6, 2001), entitled "Compact Laser Package with Integrated Temperature Control." All of the aforementioned patents and patent applications are incorporated herein in their respective entireties by this reference.

BACKGROUND

1. Technological Field

This invention is generally concerned with the field of opto-electronic systems and devices. More specifically, embodiments of the present invention relate to a header assembly for use in various optoelectronic devices.

2. Related Technology

Transistor headers, or transistor outlines ("TO"), are widely used in the field of opto-electronics, and may be employed in a variety of applications. As an example, transistor headers are sometimes used to protect sensitive electrical devices, and to electrically connect such devices to components such as printed circuit boards ("PCB").

With respect to their construction, transistor headers often consist of a cylindrical metallic base with a number of conductive leads extending completely through, and generally perpendicular to, the base. A glass hermetic seal between the conductive leads and the base provides mechanical and environmental protection for the components contained in the TO package, and electrically isolates the conductive leads from the metallic material of the base. Typically, one of the conductive leads is a ground lead that may be electrically connected directly to the base.

Various types of devices are mounted on one side of the base of the header and connected to the leads. Generally, a cap is used to enclose the side of the base where such devices are mounted, so as to form a chamber that helps prevent contamination or damage to those device(s). The specific characteristics of the cap and header generally relate to the application and the particular device being mounted on the base of the header. By way of example, in applications where an optical device is required to be mounted on the header, the cap is at least partially transparent so to allow an optical signal generated by the optical device to be transmitted from the TO package.

Although transistor headers have proven useful, typical configurations nevertheless pose a variety of unresolved problems. Some of such problems relate specifically to the physical configuration and disposition of the conductive leads in the header base. As an example, various factors conspire to compromise the ability to precisely control the electrical impedance of the glass/metal feedthru, that is, the physical bond between the conductive lead and the header base material. One such factor is the fact that there is a relatively limited number of available choices with respect to the diameter of the conductive leads that are to be employed. Further, the range of dielectric values of the sealing glass typically employed in these configurations is relatively small. And, with respect to the disposition of the conductive leads, it has proven relatively difficult in some instances to control the position of the lead with respect to the through hole in the header base.

Yet other problems in the field concern those complex electrical and electronic devices that require many isolated electrical connections in order to function properly. Typically, attributes such as the size and shape of such devices and their subcomponents are sharply constrained by various form factors, other dimensional requirements, and space limitations within the device. Consistent with such form factors, dimensional requirements, and space limitations, the diameter of a typical header is relatively small and, correspondingly, the number of leads that can be disposed in the base of the header, sometimes referred to as the input/output ("I/O") density, is relatively small as well.

Thus, while the diameter of the header base, and thus the I/O density, may be increased to the extent necessary to ensure conformance with the electrical connection requirements of the associated device, the increase in base diameter is sharply limited, if not foreclosed completely, by the form factors, dimensional requirements, and space limitations associated with the device wherein the transistor header is to be employed.

A related problem with many transistor headers concerns the implications that a relatively small number of conductive leads has with respect to the overall performance of the device wherein the transistor header is used. Specifically, devices such as semiconductor lasers operate more efficiently if their driving impedance is balanced with the impedance at the terminals. Impedance matching is often accomplished through the use of additional electrical components such as resistors, capacitors and transmission lines such as microstrips or striplines. However, such components cannot be employed unless a sufficient number of conductive leads are available in the transistor header. Thus, the limited number of conductive leads present in typical transistor headers has a direct negative effect on the performance of the semiconductor laser or other device.

In connection with the foregoing, another aspect of many transistor headers that forecloses the use of, for example, components required for impedance matching, is the relatively limited physical space available on standard headers. In particular, the relatively small amount of space on the base of the header imposes a practical limit on the number of components that may be mounted there. In order to overcome that limit, some or all of any additional components desired to be used must instead be mounted on the printed circuit board, some distance away from the laser or other device contained within the transistor header. Such arrangements are not without their shortcomings however, as the performance of active devices in the transistor header, such as lasers and integrated circuits, depends to some extent on the physical proximity of related electrical and electronic components.

The problems associated with various typical transistor headers are not, however, limited solely to geometric considerations and limitations. Yet other problems relate to the heat generated by components within, and external to, the transistor header. Specifically, transistor headers and their associated subcomponents may generate significant heat during operation. It is generally necessary to reliably and efficiently remove such heat in order to optimize performance and extend the useful life of the device.

However, transistor headers are often composed primarily of materials, Kovar® for example, that are not particularly good thermal conductors. Such poor thermal conductivity does little to alleviate heat buildup problems in the transistor header components and may, in fact, exacerbate such problems. Various cooling techniques and devices have been employed in an effort to address this problem, but with only limited success.

By way of example, solid state heat exchangers may be used to remove some heat from transistor header components. However, the effectiveness of such heat exchangers is typically compromised by the fact that, due to variables such as their configuration and/or physical location relative to the primary component(s) to be cooled, such heat exchangers frequently experience a passive heat load that is imposed by secondary components or transistor header structures not generally intended to be cooled by the heat exchanger. The imposition on the heat exchanger of such passive heat loads thus decreases the amount of heat the heat exchanger can effectively remove from the primary component that is desired to be cooled, thereby compromising the performance of the primary component.

As suggested above, the physical location of the heat exchanger or other cooling device has various implications with respect to the performance of the components employed present in the transistor header. On particular problem that arises in the context of thermoelectric cooler ("TEC") type heat exchangers relates to the fact that TECs have hot and cold junctions. The cold junction, in particular, can cause condensation if the TEC is located in a sufficiently humid environment. Such condensation may materially impair the operation of components in the transistor header, and elsewhere.

Another concern with respect to heat exchangers is that the dimensions of typical transistor headers are, as noted earlier, constrained by various factors. Thus, while the passive heat load placed on a heat exchanger could be at least partly offset through the use of a relatively larger heat exchanger, the diametric and other constraints imposed on transistor headers by form factor requirements and other considerations place practical limits on the maximum size of the heat exchanger.

Finally, even if a relatively large heat exchanger could be employed in an attempt to offset the effects of passive heat loads, large heat exchangers present problems in cases where the heat exchanger, such as a TEC, is used to modify the performance of transistor header components such as lasers. For example, by virtue of their relatively large size, such heat exchangers are not well suited to implementing the rapid changes in laser performance that are required in many applications because such large heat exchangers heat up and cool down relatively slowly. Moreover, the performance of the laser or other component may be further compromised if the heat exchanger is located relatively far away from the laser because the rate at which heat can be transferred with respect to the laser or other component is at least partially a function of the distance between the component and the heat exchanger.

In view of the foregoing discussion, what is needed is a transistor header having features directed to addressing the foregoing exemplary concerns, as well as other concerns not specifically enumerated herein. An exemplary transistor header should implement a relatively high I/O density without increasing the relative diameter of the header. Moreover, the exemplary transistor header should be configured to precisely control the electrical impedance and permit location of various components in relatively close proximity to the active components, such as a laser, within the header without violating applicable form factors or other geometric and dimensional standards. Finally, the exemplary transistor header should include features directed to facilitating a relative improvement in heat management capability within the transistor header.

BRIEF SUMMARY OF AN EXEMPLARY EMBODIMENT OF THE INVENTION

In general, embodiments of the invention are concerned with a transistor header including various features directed to enhancing the reliability and performance of various electronic devices, such as lasers, included in the transistor header.

In one exemplary embodiment, a transistor header is provided that includes a substantially cylindrical metallic base as well as a platform disposed in a substantially perpendicular orientation with respect to the base and extending through both sides of the base. The platform is constructed from an insulating material such as a ceramic. The platform is hermetically sealed to the base, and flat surfaces defined by the platform on either side of the base are configured to receive multiple electrical components. Moreover, the platform includes a plurality of conductive pathway(s) extending between the ends of the platform so that components on opposite sides of the base may be electrically connected with each other. On one end of the platform, a connector is provided that is in electrical communication with some or all of such conductive pathways.

In this exemplary embodiment, a laser is disposed on top of a TEC, which, in turn, is mounted to the platform. A cup having a transparent portion is situated on the base cooperates with the platform and the base to define a hermetic chamber enclosing the laser and the TEC. Power is supplied to the TEC by way of a laser control system that communicates both with a light intensity measuring device optically coupled to the laser and with a temperature sensing device thermally coupled to the laser.

In operation, power is supplied to the laser by way of the connector on the platform and the laser emits light through the transparent portion of the cup. The light intensity measuring device and the temperature sensing device provide data on the light intensity of the laser as a function of laser temperature and transmit the data to a control circuit which adjusts the power applied to the TEC, thereby raising or lowering the temperature of the laser as necessary to meet the laser performance requirements.

These and other, aspects of embodiments of the present invention will become more fully apparent from the following description and appended claims.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF EMBODIMENTS OF THE INVENTION

Reference will now be made to figures wherein like structures will be provided with like reference designations. It is to be understood that the drawings are diagrammatic and schematic representations of various embodiments of the claimed invention, and are not to be construed as limiting the scope of the present invention in any way, nor are the drawings necessarily drawn to scale.

Figure 1A:
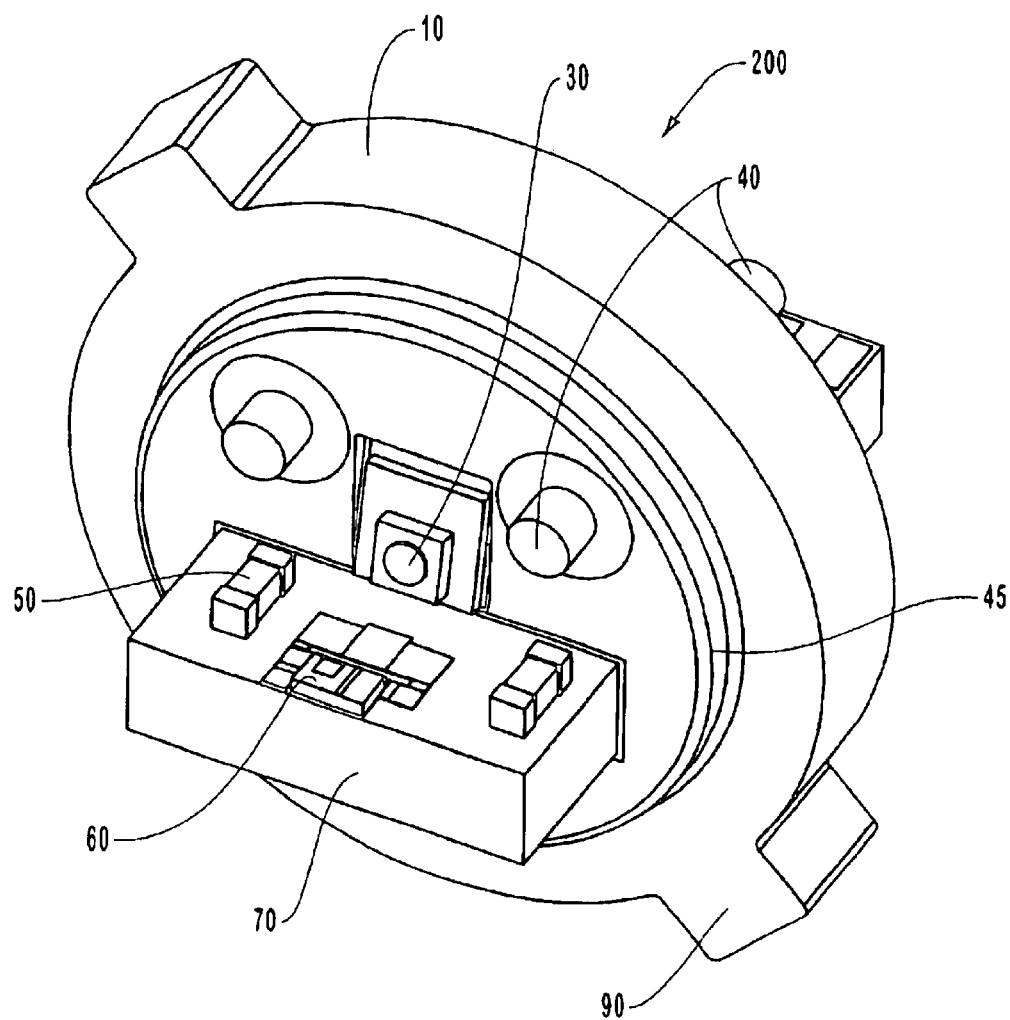
FIG. 1A is a perspective view illustrating various aspects of the device side of an exemplary embodiment of a header assembly.
Figure 1B:
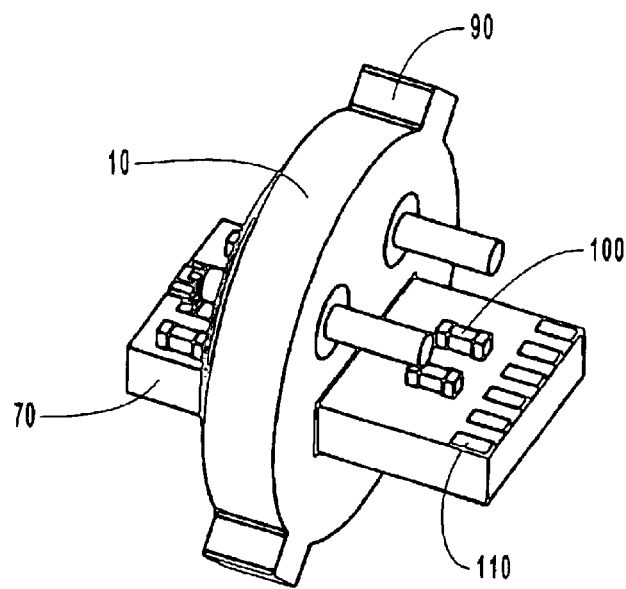
FIG. 1B is a perspective view illustrating various aspects of the connector side of an exemplary embodiment of a header assembly.

Reference is first made to FIGS. 1A and 1B together, which illustrate perspective views of one presently preferred embodiment of a header assembly, designated generally at 200. In the illustrated example, the header assembly 200 includes a substantially cylindrical metallic base 10. The base 10 includes two flanges 90 used to control angular or rotational alignment of the header 200 to a receptacle (not shown) on a higher level opto-mechanical assembly. The base can be formed of Alloy 42, which is an iron nickel alloy, as well as cold-rolled steel, or Vacon VCF-25 Alloy. The base 10 also includes a ceramic platform 70 extending perpendicularly through the base as shown. The ceramic platform is hermetically sealed to the base to provide mechanical and environmental protection for the components contained in the TO package.

The hermetic seal between the base 10 and the platform 70 is created by electrically insulating glass-to-metal seals. Alternatively, the platform 70 may incorporate two additional ceramic outer layers to electrically isolate the outermost conductors. In this second case, a metal braze or solder can be used to hermetically seal the platform 70 to the metal base. This solution overcomes the principal shortcomings of glasses, namely their low strength, brittleness, and low thermal conductivity.

The platform 70 is structured to house multiple electrical components 50 and 100, and active devices 60 on either side of the base. In the illustrated embodiment, the active device 60 comprises a semiconductor laser, and the components 50 and 100 are resistors, capacitors, and inductors that are used to balance the driving impedance of the laser with the component impedance. As it is important for a semiconductor laser to be precisely positioned perpendicularly to the base 10, platform 70 is, therefore, precisely positioned perpendicularly with respect to the base 10.

Where active device 60 comprises a semiconductor laser, a small deviation in the position of active device 60, in relation to base 10 can cause a large deviation in the direction of the emitted laser beam. Accurate perpendicularity between the platform and the base can be achieved by incorporating a vertical pedestal feature in the base material, as shown on FIG. 1A. The vertical pedestal houses the photodiode 30 in the embodiment shown in FIG. 1A. Such feature can be machined, stamped, or metal injection molded directly with the base thus providing a stable and geometrically accurate surface for mating with the platform.

The platform 70 further includes multiple electrically isolated conductive pathways 110 extending throughout the platform 70 and consequently through the base 10. The conductive pathways 110 provide the electrical connections necessary between electrical devices or components located throughout the platform 70. The conductive pathways 110 form a connector on that side of the base that does not include the semiconductor laser 60, also referred to herein as the "connector side" of the base. Note in connection with the foregoing that the side of the base where the active device 60 is located may in some instances be referred to herein as the "device side" of the base.

The connector formed by the conductive pathways 110 is used to electrically connect the header assembly 200 to a second electrical subassembly, such as a printed circuit board, either directly (for example, by solder connection) or indirectly by an intermediary device such as a flexible printed circuit. The semiconductor laser 60 is electrically connected to the electrical components 50 and 100 via the conductive pathways 10. In one embodiment, the platform 70 is itself a printed circuit board having conductive pathways 10 formed therein.

The use of advanced ceramic materials, examples of which include aluminum nitride and beryllia, allows the header assembly 200 to achieve substantially lower thermal resistances between the devices inside the package and the outside world where heat is ultimately transferred. As discussed in further detail below in the context of an alternative embodiment of the invention, a cooling device, such as a thermoelectric cooler ("TEC"), a heat pipe or a metal heat spreader, can be mounted directly on the platform, thereby providing for a very short thermal path between the temperature sensitive devices on the platform and a heat sink located outside the header assembly.

As is further shown in FIGS. 1A and 1B, the header assembly 200 can additionally include two conductive leads 40 extending through and out both sides of the base 10. The conductive leads 40 are hermetically sealed to the base 10 to provide mechanical and environmental protection for the components contained in the TO package between the conductive leads 40 and the base 10. The hermetic seal between the conductive leads 40 and the base 10 is created, for example, by glass or other comparable hermetic insulating materials that are known in the art. The conductive leads 40 can also be used to electrically connect devices and/or components located on opposite sides of the base.

In the illustrated embodiment at least, the conductive leads 40 extend out from the side of the base 10 that does not contain the semiconductor laser 60, in a manner that allows for the electrical connection of the header assembly 200 with a specific header receptacle located on, for example, a printed circuit board. It is important to note that conductive pathways 110 and conductive leads 40 perform the same function and that the number of potential conductive pathways 110 is far greater than the potential number of conductive leads 40. Therefore, alternative embodiments can incorporate even more conductive pathways 110 than shown in the illustrated embodiment.

The platform 70 further includes steps and recessed areas that permit mounting devices with various thicknesses flush with the metal pads on the ceramic. This allows the use of the shortest electrical interconnects, wire bonds for example, having improved electrical performance and characteristics.

The photodiode 30 is used to detect the signal strength of the semiconductor laser 60 and relay this information back to control circuitry (see FIG. 5) of the semiconductor laser 60. In the illustrated embodiment, the photodiode can be directly connected to the conductive leads 40. Alternatively, the photodiode can be mounted directly onto the same platform as the laser, in a recessed position with respect to the light emitting area. This recessed position allows the photodiode to capture a fraction of the light emitted by the laser, thus allowing the photodiode to perform the same monitoring function. In yet another configuration, as shown in FIG. 4C, a monitor photodiode 1004 with an angled facet can be mounted in a plane behind the laser diode. The angled facet deflects the light emitted from the back-facet of the laser upwards toward the sensitive area of the detector.

The configurations of the monitoring photodiode discussed in the previous paragraph allow for eliminating the need of conductive leads 40, and lends themselves to simplified electrical connections, such as wire bonds, to the conductive pathways 110 of the platform 70. In an alternative embodiment, the photodiode light gathering can be increased by positioning an optical element on the base for focusing or redirecting light, such as a mirror, or by directly shaping and/or coating the base metal to focus additional light onto the photodiode As is further shown in FIG. 1A, the base 10 includes a protruding portion 45 that is configured to releasably position or locate a cap (not shown) over one side of the base 10. A cap can be placed over the side of the base 10 containing the semiconductor laser 60 for the purpose of protecting the semiconductor laser 60 from potentially destructive particles. A transparent cap is preferable for the illustrated embodiment so as to allow the laser light to escape the region between the cap and the base 10.

Figure 2A:
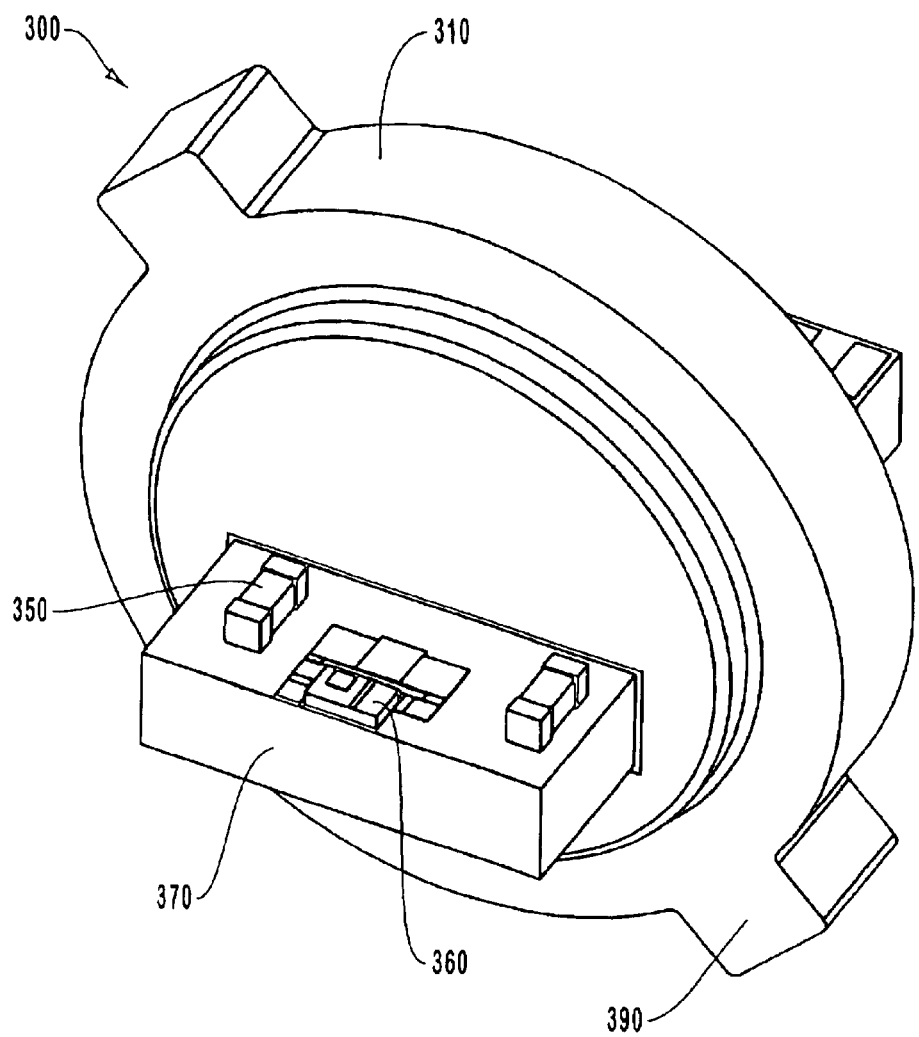
FIG. 2A is a perspective view illustrating various aspects of the device side of an alternative embodiment of a header assembly.
Figure 2B:
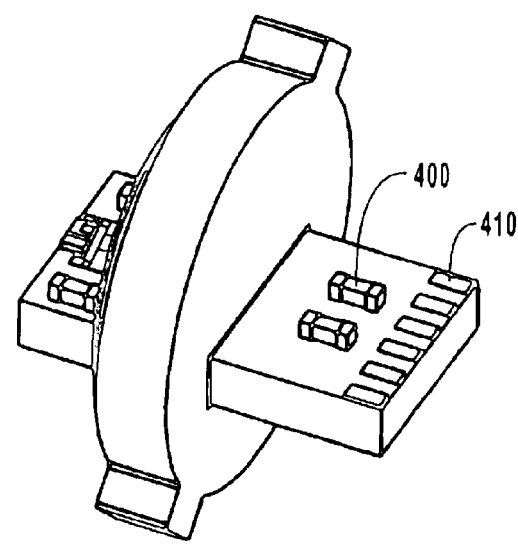
FIG. 2B is a perspective view illustrating various aspects of the connector side of an alternative embodiment of a header assembly.

Reference is next made to FIGS. 2A and 2B, which illustrate perspective views of an alternative embodiment of a header assembly, designated generally at 300. This alternative embodiment shows an optical receiver 360 mounted horizontally on the platform 370 perpendicularly bisecting the base 310 of the header assembly 300. The optical receiver can be a photodetector or any other device capable of receiving optical signals. The optical receiver 360 is mounted flat on the platform 370 and detects light signals through the side facing away from the base 310. This type of optical receiver is sometimes referred to as an "edge detecting" detector. The base 310 and platform 370 are described in more detail with reference to FIGS. 1A and 1B. The platform 370 contains electrical components 350, 400 on either side of the base for operating the optical receiver 360. The platform 370 also includes conductive pathways 410 for electrically connecting devices or components on either side of the base 310. This embodiment of a header assembly does not contain conductive leads and therefore all electrical connections are made via the conductive pathways 410.

Figure 3A:
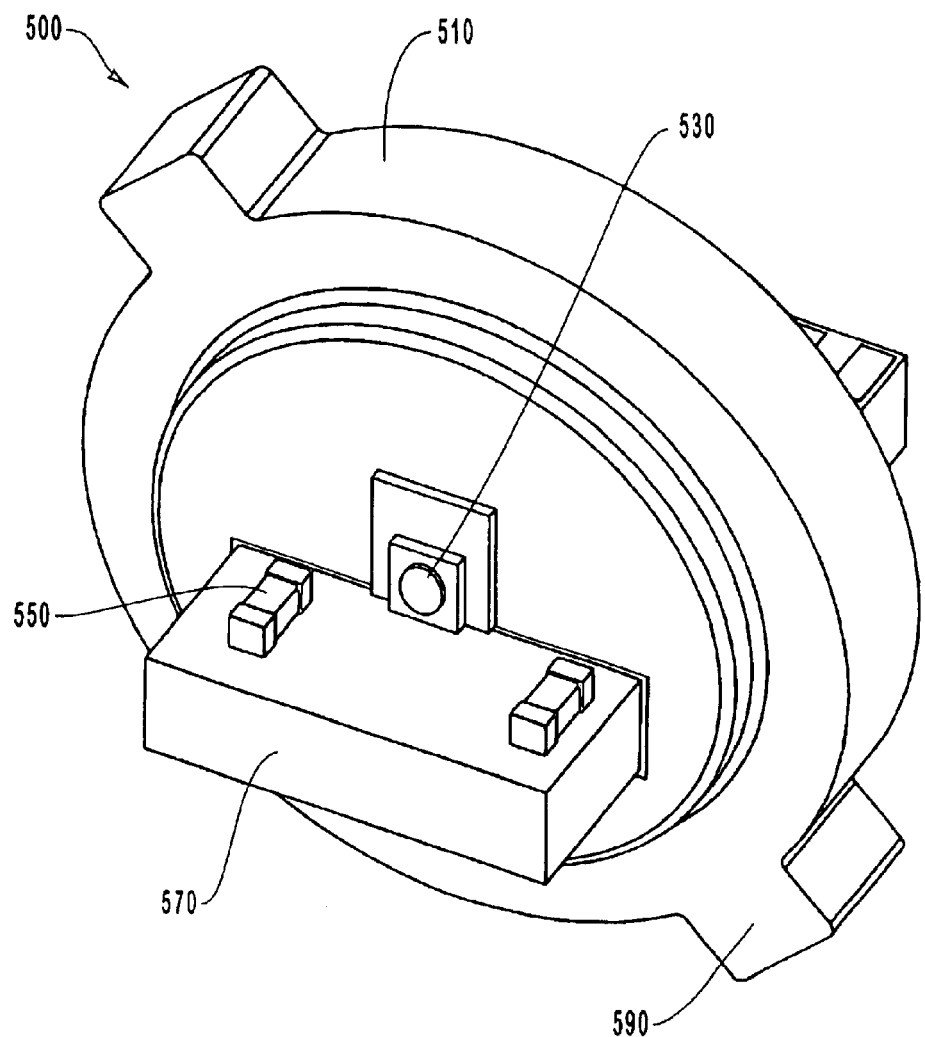
FIG. 3A is a perspective view illustrating various aspects of the device side of another alternative embodiment of a header assembly.
Figure 3B:
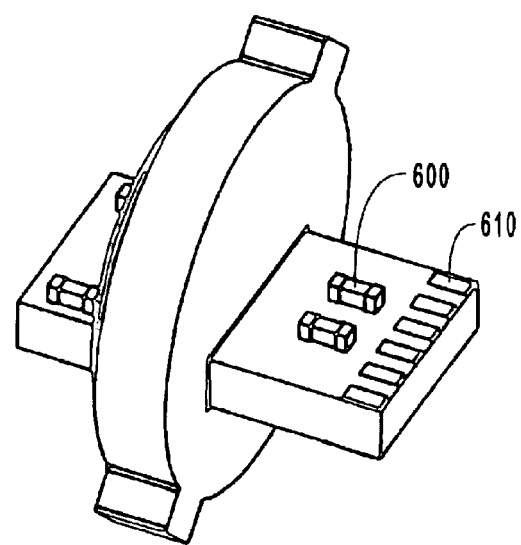
FIG. 3B is a perspective view illustrating various aspects of the connector side of another alternative embodiment of a header assembly.

Reference is next made to FIGS. 3A and 3B, which illustrate perspective views of yet another alternative embodiment of a header assembly, designated generally at 500. This alternative embodiment also shows an optical receiver 530 mounted vertically on the base 510. The optical receiver can be a photodetector or any other device capable of receiving optical signals. This is an optical receiver 530 which detects light signals from the top of the device. The base 510 and platform 570 are described in more detail with reference to FIGS. 1A and 1B. The platform 570 contains electrical components 550, 600 on either side of the base for operating the optical receiver 530. The platform 570 also includes conductive pathways 510 for electrically connecting devices or components on either side of the base 510. This embodiment of a header assembly does not contain conductive leads and therefore all electrical connections are made via the conductive pathways 410.

Directing attention now to FIGS. 4A through 4D, various aspects of an alternative embodiment of a header assembly, generally designated at 700, are illustrated. The embodiment of the header assembly illustrated in FIGS. 4A through 4D is similar in many regards to one or more of the embodiments of the header assembly illustrated in FIGS. 1A through 3B. Accordingly, the discussions of FIGS. 4A through 4D will focus primarily on certain selected aspects of the header assembly 700 illustrated there. Note that in one embodiment of the invention, header assembly 700 comprises a transistor header. However, header assembly 700 is not limited solely to that exemplary embodiment.

As indicated in FIGS. 4A through 4D, header assembly 700 generally includes a base 702 through which a platform 800 passes. Platform 800 may comprise a printed circuit board or, as discussed herein, may comprise other materials and/or configurations as well. The platform 800 is configured to receive a cooling device 900 upon which various devices and circuitry are mounted. Note that while it may be referred to herein as a "cooling" device 900, the cooling device 900 may, depending upon its type and the application where it is employed, serve both to heat and/or cool various components and devices. Finally, a cap 704 mounted to, and cooperating with, base 702, serves to define a hermetic chamber 706 which encloses cooling device 900 and the mounted devices and circuitry.

As discussed in further detail below, a variety of means may be employed to perform the functions disclosed herein, of a cooling device. Thus, the embodiments of the cooling device disclosed and discussed herein are but exemplary structures that function as a means for transferring heat. Accordingly, it should be understood that such structural configurations are presented herein solely by way of example and should not be construed as limiting the scope of the present invention in any way. Rather, any other structure or combination of structures effective in implementing the functionality disclosed herein may likewise be employed.

Figure 4A:
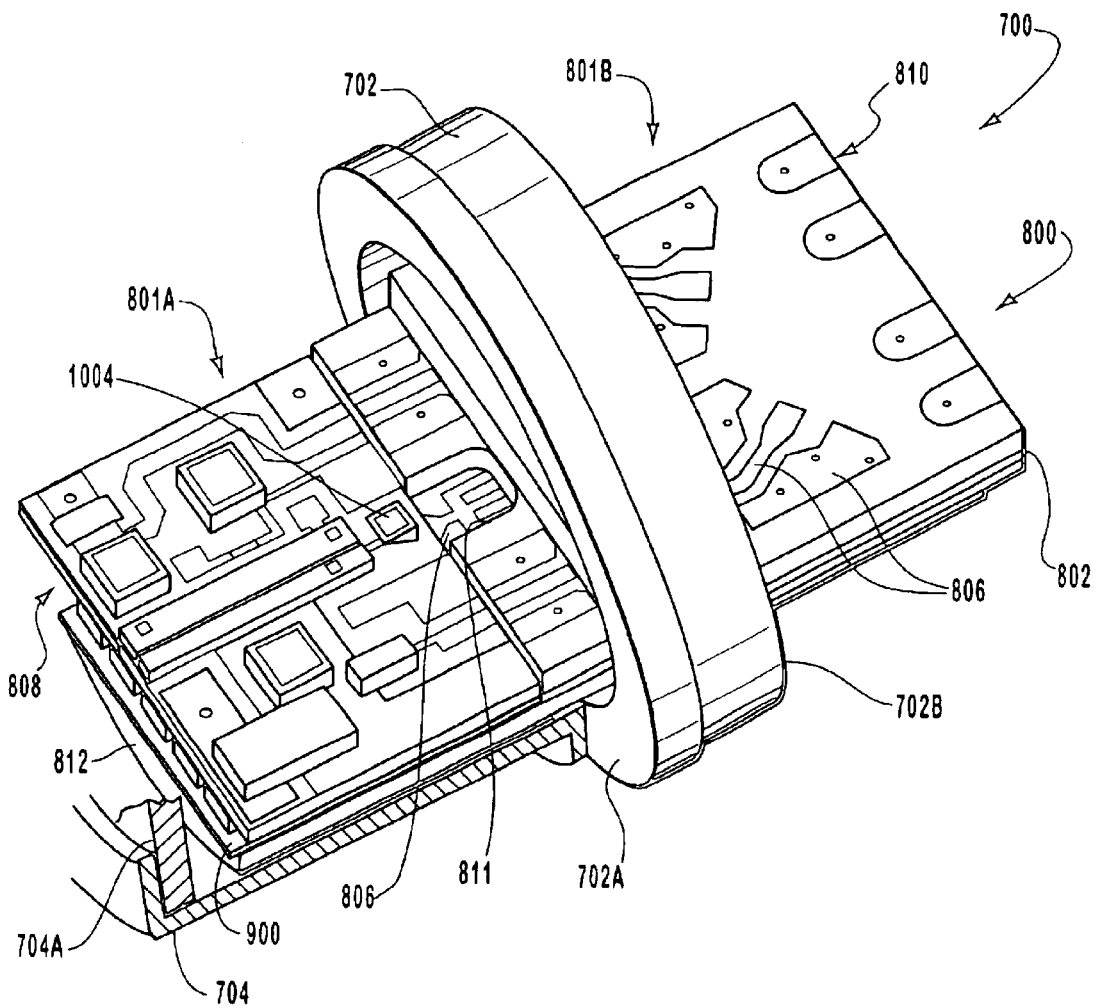
FIG. 4A is a top perspective view of an exemplary embodiment of a header including active devices mounted on a TEC disposed within a hermetic chamber.
Figure 4B:
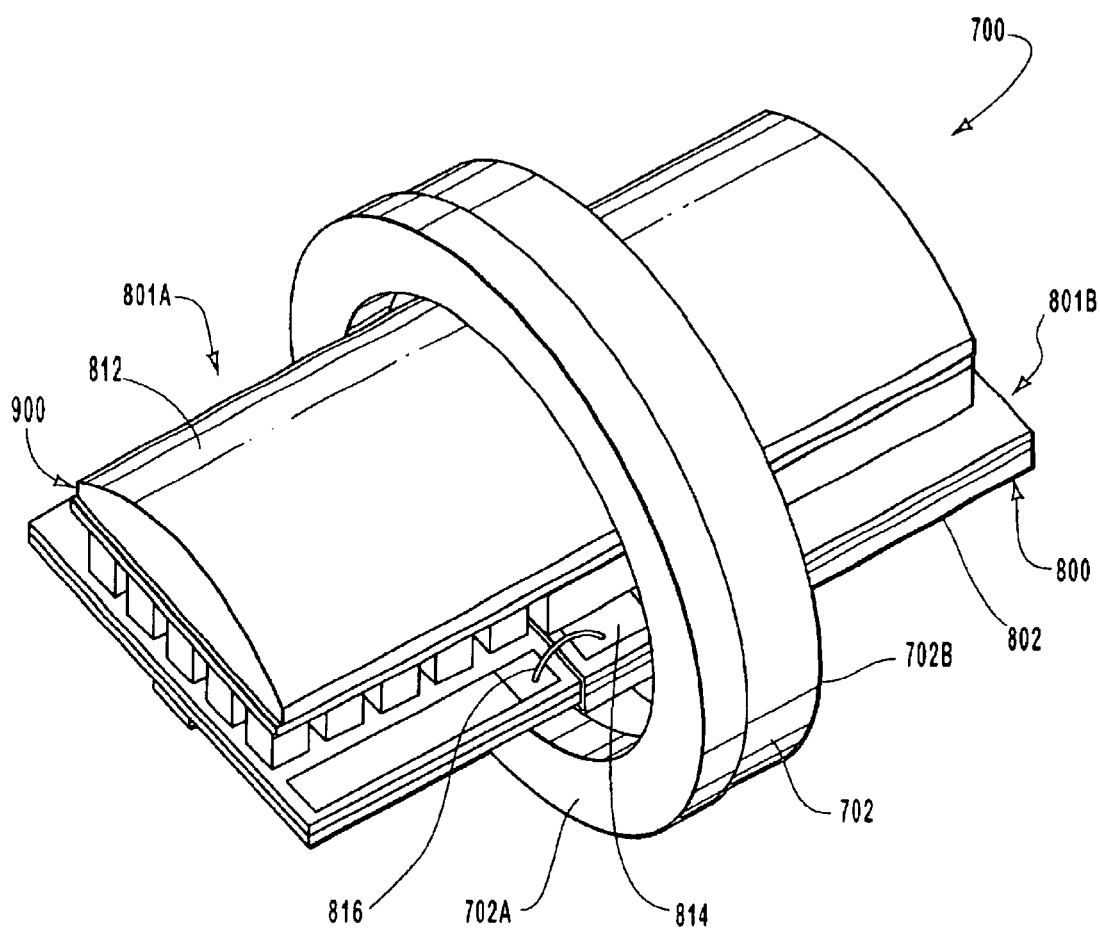
FIG. 4B is a bottom perspective view of the exemplary embodiment illustrated in FIG. 4A.
Figure 4C:
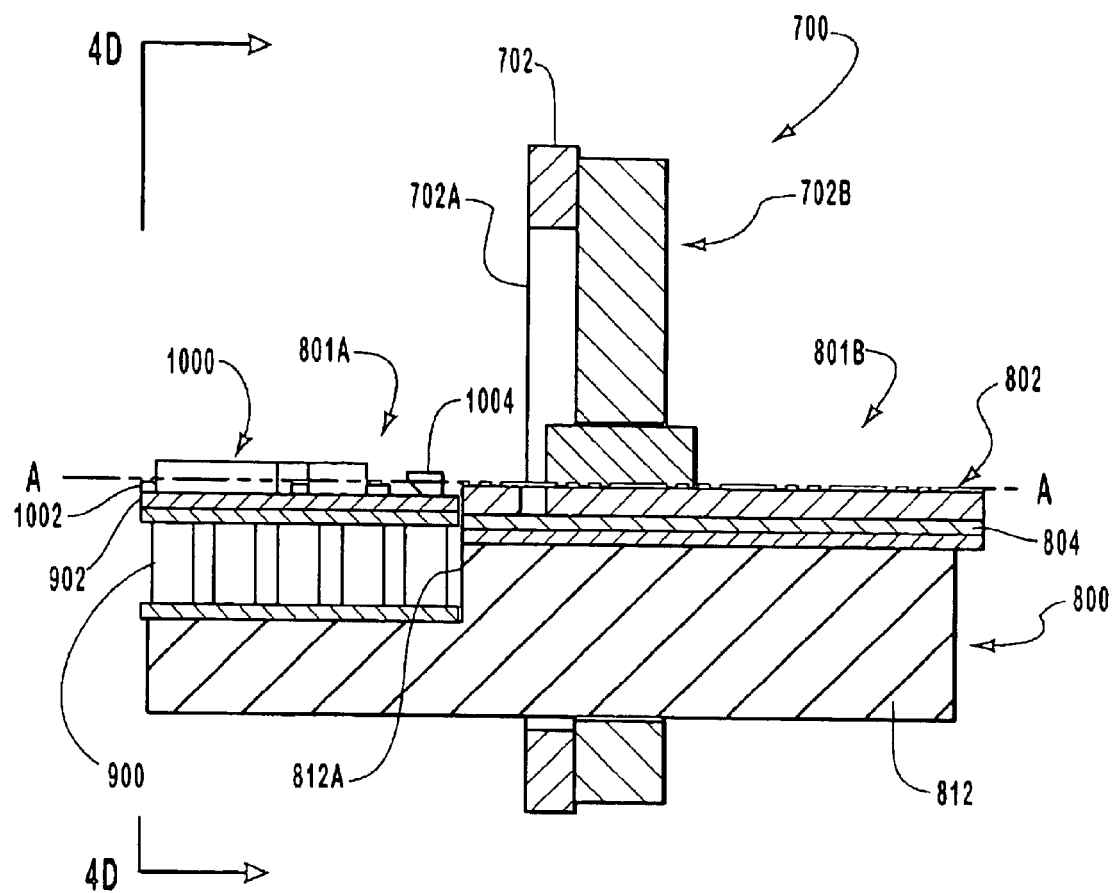
FIG. 4C is a cross-section view illustrating various aspects of the exemplary embodiment presented in FIGS. 4A and 4B.
Figure 4D:
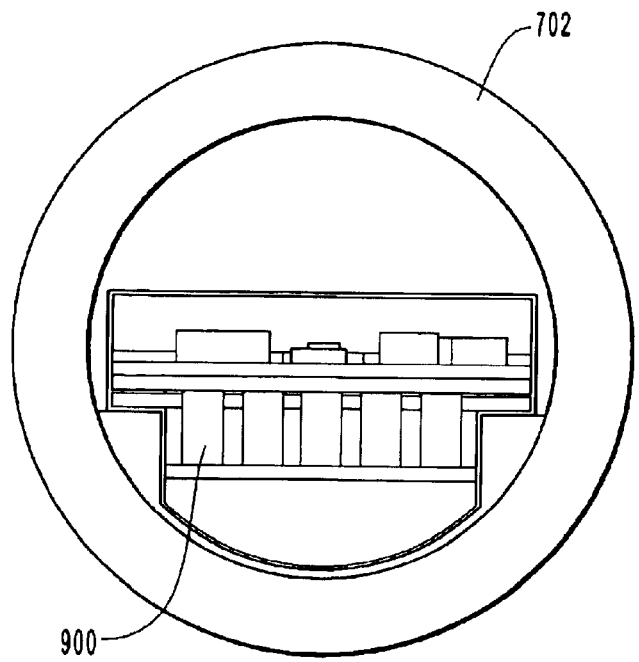
FIG. 4D is a cross-section view taken along line 4D—4D of FIG. 4C and illustrates various aspects of an exemplary arrangement of a TEC in a header assembly.

With continuing attention to FIGS. 4A and 4B, and directing attention also to FIGS. 4C and 4D, further details are provided concerning various aspects of platform 800. In the illustrated embodiment, platform 800 is disposed substantially perpendicularly with respect to base 702. In particular, base 702 includes a device side 702A and a connector side 702B, and platform 800 passes completely through base 702, so that an inside portion 801A of platform 800 is disposed on device side 702A of base 700 and outside portion 801B of platform 800 is disposed on connector side 702B of base 702. However, this arrangement of platform 800 is exemplary only, and various other arrangements of platform 800 may alternatively be employed consistent with the requirements of a particular application.

In the illustrated embodiment, platform 800 includes a first feedthru 802 having a multi-layer construction that includes one or more layers 804 of conductive pathways 806 (see FIG. 4A). In general, conductive pathways 806 permit electrical communication among the various components and devices (removed for clarity) disposed on platform 800, while also permitting such components and devices to electrically communicate with other components and devices that are not a part of platform 800. Moreover, conductive pathways 806 cooperate to form a connector 810 situated on the outside portion 801B of platform 800, on the connector side 702B of base 700. In general, connector 810 facilitates electrical communication between header assembly 700 and other components and devices such as, but not limited to, printed circuit boards (see FIG. 4E). In one embodiment, connector 810 comprises an edge connector, but any other form of connector may alternatively be used, consistent with the requirements of a particular application. As discussed in further detail below, first feedthru 802 may include cutouts 811 or other geometric features which permit direct access to, and electrical connection with, one or more conductive pathways 806 disposed on an inner layer of first feedthru 802.

In addition to the first feedthru 802, platform 800 further includes a second feedthru 812 to which the first feedthru 802 is attached. Note that in the exemplary illustrated embodiment, first feedthru 810, with the exception of conductive pathways 806, may comprise a material that is generally resistant to heat conduction, such as a ceramic with low thermal conductivity, such as alumina for example. Low thermal conductivity ceramics may be more desirable in some instances than high thermal conductivity ceramics, such as aluminum nitrade or beryllia, due to the relatively lower cost of such low thermal conductivity ceramics, as well as the ease with which such low thermal conductivity ceramics can be brazed to various metals such as may be used in the construction of header assembly 700. In contrast, second feedthru 812 in the illustrated embodiment comprises a material that is generally useful as a heat conductor, such as a metal. Various copper-tungsten alloys are examples of metals that are suitable in some applications. Thus, platform 800 is generally configured to combine heat conductive elements with non-heat conductive elements so as to produce a desired effect or result concerning the device wherein platform 800 is employed.

In connection with the foregoing, it should be noted further that ceramics and metals are exemplary materials only and any other material or combination thereof that will facilitate implementation of the functionality disclosed herein may alternatively be employed. Moreover, other embodiments of the invention may employ different arrangements and numbers of, for example, conductive and non-conductive feedthrus, or feedthrus having other desirable characteristics. Accordingly, the illustrated embodiments are exemplary only and should not be construed to limit the scope of the invention in any way.

With respect to their configurations, the geometry of both first feedthru 802 and second feedthru 812 may generally be configured as necessary to suit the requirements of a particular application or device. In the exemplary embodiment illustrated in FIGS. 4A through 4D, second feedthru 812 incorporates a step 812A feature which serves to, among other things, provide support for cooling device 900 and, as discussed in further detail below, to ensure that devices mounted to cooling device 900 are situated at a desirable location and orientation. As further indicated in FIG. 4D, for example, second feedthru 812 defines a semi-cylindrical bottom that generally conforms to the shape of cap 704 and contributes to the stability of cooling device 900, as well as providing a relatively large conductive mass that aids in heat conduction to and/or from, as applicable, cooling device 900 and other devices.

As suggested earlier, platform 800 also serves to provide support to cooling device 900. Directing renewed attention now to FIGS. 4A through 4D, details are provided concerning various aspects of cooling device 900. In particular, a cooling device 900 is provided that is mounted directly to platform 800. In an exemplary embodiment, cooling device 900 comprises a thermoelectric cooler ("TEC") that relies for its operation and usefulness on the Peltier effect wherein electrical power supplied to the TEC may, according to the requirements of a particular application, cause selected portions of the TEC to generate heat and/or provide a cooling effect. Exemplary construction materials for the TEC may include, but are not limited to, bismuth-telluride combinations, or other materials with suitable thermoelectric properties.

Note that the TEC represents an exemplary configuration only, and various other types of cooling devices may alternatively be employed as required to suit the dictates of a particular application. By way of example, where active temperature control of one or more electronic devices 1000, aspects of which are discussed in more detail below, is not required, the TEC may be replaced with a thermally conductive spacer or similar device.

In addition to providing heating and/or cooling functionality, cooling device 900 also includes a submount 902 that supports various electronic devices 1000 such as, but not limited to, resistors, capacitors, and inductors, as well as optical devices such as mirrors, lasers, and optical receivers. Thus, cooling device 900 is directly thermally coupled to electronic devices 1000.

In one exemplary embodiment, the electronic devices 1000 include a laser 1002, such as a semiconductor laser, or other optical signal source. With regard to devices such as laser 1002, at least, cooling device 900 is positioned and configured to ensure that laser 1002 is maintained in a desired position and orientation. By way of example, in some embodiments of the invention, cooling device 900 is positioned so that an emitting surface of laser 102 is positioned at, and aligned with, a longitudinal axis A-A of header assembly 700 (FIG. 4C).

Note that although reference is made herein to the use of a laser 1002 in conjunction with cooling device 900, it should be understood that embodiments employing laser 1002 are exemplary only and that additional or alternative devices may likewise be employed. Accordingly, the scope of the invention should not be construed to be limited solely to lasers and laser applications.

In at least some of those embodiments where a laser 1002 is employed, a photodiode 1004 and thermistor 1006 (see FIG. 4D) are also mounted to, or proximate, submount 902 of cooling device 900. In general, photodiode 1004 is optically coupled with laser 1002 such that photodiode 1004 receives at least a portion of the light emitted by laser 1002, and thereby aids in gathering light intensity data concerning laser 1002 emissions. Further, thermistor 1006 is thermally coupled with laser 1002, thus permitting the gathering of data concerning the temperature of laser 1002.

In some embodiments, photodiode 1004 comprises a 45 degree monitor photodiode. The use of this type of diode permits the related components, such as laser 1002 and thermistor 1006 for example, to be mounted and wirebonded on the same surface. Typically, the 45 degree monitor diode is arranged so that light emitted from the back of laser 1002 is refracted on an inclined surface of the monitor diode and captured on a top sensitive surface of the monitor diode. In this way, the monitor diode is able to sense the intensity of the optical signal emitted by the laser.

Note that in those embodiments where a laser 1002 is employed, cap 704 includes an optically transparent portion, or window, 704A through which light signals generated by the laser 1002 are emitted. Similarly, in the event electronic device 1000 comprises other optical devices, such as an optical receiver, cap 704 would likewise include a window 704A so as to permit reception, by the optical receiver, of light signals. As suggested by the foregoing, the construction and configuration of cap 704 may generally be selected as required to suit the parameters of a particular application.

In view of the foregoing general discussion concerning various electronic devices 1000 that may be employed in conjunction with cooling device 900, further attention is directed now to certain aspects of the relation between such electronic devices 1000 and cooling device 900. In general, cooling device 900 may be employed to remove heat from, or add heat to, one or more of the electronic devices 1000, such as laser 1002, in order to achieve a desired effect. As discussed in further detail herein, the capability to add and remove heat, as necessary, from a device such as laser 1002, may be employed to control the performance of laser 1002.

In an exemplary embodiment, the heating and cooling, as applicable, of electronic devices 1000 is achieved with a cooling device 900 that comprises a TEC. Various aspects of the arrangement and disposition of electronic devices 1000, as well as cooling device 900, serve to enhance these ends. By way of example, the fact that electronic devices 1000 are mounted directly to cooling device 900 results in a relatively short thermal path between electronic devices 1000 and cooling device 900. Generally, such a relatively shorter thermal path between components translates to a corresponding increase in the efficiency with which heat may be transferred between those components. Such a result is particularly useful where devices whose operation and performance is highly sensitive to heat and temperature changes, such as lasers, are concerned. Moreover, a relatively short thermal path also permits the transfer of heat to be implemented relatively more quickly than would otherwise be the case. Because heat transfer is implemented relatively quickly, this exemplary arrangement can be used to effectively and reliably maintain the temperature of laser 1002 or other devices.

Another aspect of at least some embodiments relates to the location of cooling device 900 relative, not just to electronic devices 1000, but to other components, devices, and structures of header assembly 700. In particular, because cooling device 900 is located so that the potential for heat transmission, whether radiative, conductive, or convective, from other components, devices, and structures of header assembly 700 to cooling device 900 is relatively limited, the passive heat load imposed on cooling device 900 by such other components and structures is relatively small. Note that, as contemplated herein, the "passive" heat load generally refers to heat transferred to cooling device 900 by structures and devices other than those upon which cooling device 900 is primarily intended to exert a heating and/or cooling effect. Thus, in this exemplary embodiment, "passive" heat loads refers to all heat loads imposed on cooling device 900 except for those heat loads imposed by electronic devices 1000.

The relative reduction in heat load experienced by cooling device 900 as a consequence of its location has a variety of implications. For example, the reduced heat load means that a relatively smaller cooling device 900 may be employed than would otherwise be the case. This is a desirable result, particularly in applications such as header assemblies where space may be limited. As another example, a relatively smaller cooling device 900, at least where cooling device 900 comprises a TEC, translates to a relative decrease in the amount of electrical power required to operate cooling device 900.

Another consideration relating to the location of cooling device 900 concerns the performance of laser 1002 and the other electronic components 1000 disposed in hermetic chamber 706. In particular, the placement of cooling devices 900, such as TECs that include a "cold" connection, in hermetic chamber 706 substantially forecloses the occurrence of condensation, and the resulting damage to other components and devices of header assembly 700, caused by the cold connection, that might otherwise result if cooling device 900 were located outside hermetic chamber 706.

In addition to the heat transfer effects that may be achieved by way of the location of cooling device 900, and the relatively short thermal path that is defined between cooling device 900 and the electronic devices 1000 mounted to submount 902 of cooling device 900, yet other heat transfer effects may be realized by way of various modifications to the geometry of cooling device 900. In connection with the foregoing, it is generally the case that by increasing the size of cooling device 900, a relative increase in the capacity of cooling device 900 to process heat will be realized.

In this regard, it should be noted that it is the case in many applications that the diameter of base 702 is often constrained to fit within certain predetermined form factors or dimensional requirements and that such form factors and dimensional requirements, accordingly, have certain implications with respect to the geometric and dimensional configuration of cooling device 900.

By way of example, the diametric requirements placed on base 702 may serve to limit the overall height and width of cooling device 900 (see, e.g., FIG. 4D). In contrast however, the overall length of header assembly 700 is generally not so rigidly constrained. Accordingly, certain aspects of cooling device 900, such as its length for example, may desirably be adjusted to suit the requirements of a particular application. In the case of a TEC, for example, such a dimensional increase translates into a relative increase in the amount of heat that cooling device 900 can process. As noted earlier, such heat processing may include transmitting heat to, and/or removing heat from, one or more of the electronic components 1000, such as laser 1002.

Moreover, various dimensions and geometric aspects of cooling device 900 may be varied to achieve other thermal effects as well. By way of example, in the event cooling device 900 comprises a TEC, a relatively smaller cooling device 900 will permit relatively quicker changes in the temperature of electronic devices 1000 mounted thereto. In the case where electronic device 1000 comprises a laser, this capability is particularly desirable as it lends itself to control of laser performance through the vehicle of temperature adjustments.

Turning now to consideration of the power requirements for cooling device 900, at least where it comprises a TEC, and electronic devices 1000, it was suggested earlier herein that those devices typically rely for their operation on a supply of electrical power. Generally, the TEC must be electrically connected with platform 800 so that power for the operation of the TEC, transmitted from a power source (not shown) to platform 800, can be directed to the TEC. Additionally, power is supplied to electronic devices 1000 by way of platform 800, and electronic devices 1000 must, accordingly, be connected with one or more of the conductive pathways 806 of platform 800.

Figure 4E:
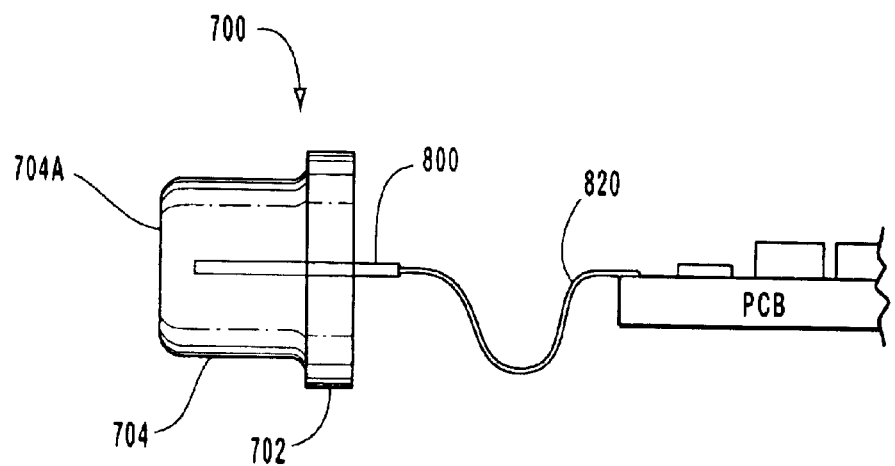
FIG. 4E is a side view illustrating aspects of an exemplary electrical connection scheme for the header assembly and a printed circuit board.

The foregoing electrical connections and configurations may be implemented in a variety of ways. Various aspects of exemplary connection schemes are illustrated in FIGS. 4A, 4B and 4E. With reference first to FIG. 4B, the underside of submount 902 of cooling device 900 is connected with conductive elements 814 disposed on the underside of first feedthru 802, by way of connectors 816 such as, but not limited to, wire bonds. Such conductive elements 814 may be electrically connected with selected conductive pathways 806 (see FIG. 4A) and/or connector 810, that are ultimately connected with an electrical power source (not shown).

Directing attention next to FIG. 4A, details are provided concerning various aspects of the electrical connection of electronic devices 1000 disposed on submount 902. As noted earlier, and illustrated in FIG. 4A, some embodiments of platform 800 include one or more cutouts 811, or other geometric feature, that permits direct connection of electronic devices 1000, such as laser 1002 to one or more conductive pathways 806 disposed within first feedthru 802 of platform 800. This connection may be implemented by way of connectors 818 such as bond wires, or other appropriate structures or devices. In addition to the aforementioned connection, and as illustrated in FIG. 4E, at least some embodiments of the invention further include a flex circuit 820, or similar device, which serves to electrically interconnect platform 800 of header assembly 700 with another device, such as a printed circuit board.

With attention now to FIGS. 4A through 4D, details are provided concerning various operational aspects of header assembly 700. In general, power is provided to laser 1002 and/or other electrical components 1000 by way of connector 810, conductive pathways 806, and connectors 818. In response, laser 1002 emits an optical signal. Heat generated as a result of the operation of laser 1002, and/or other electronic components 1000, is continuously removed by cooling device 900, which comprises a TEC in at least those cases where a laser 1002 is employed in header assembly 700, and transferred to second feedthru 812 upon which cooling device 900 is mounted. Ultimately, second feedthru 812 transfers heat received from cooling device 900 out of header assembly 700.

Because cooling device 900 is disposed within hermetic chamber 706, the cold junction on cooling device 900, where it comprises a TEC, does not produce any undesirable condensation that could harm other components or devices of header assembly 700. Moreover, the substantial elimination of passive heat loads on cooling device 900, coupled with the definition of a relatively short thermal path between electronic components 1000, such as laser 1002, and cooling device 900, further enhances the efficiency with which heat can be removed from such electronic components and, accordingly, permits the use of relatively smaller cooling devices 900. And, as discussed earlier, the relatively small size of cooling device 900 translates to a relative decrease in the power required to operate cooling device 900. Yet other operational aspects of embodiments of the invention are considered in further detail below in the context of the discussion of a laser control system.

Figure 4F:
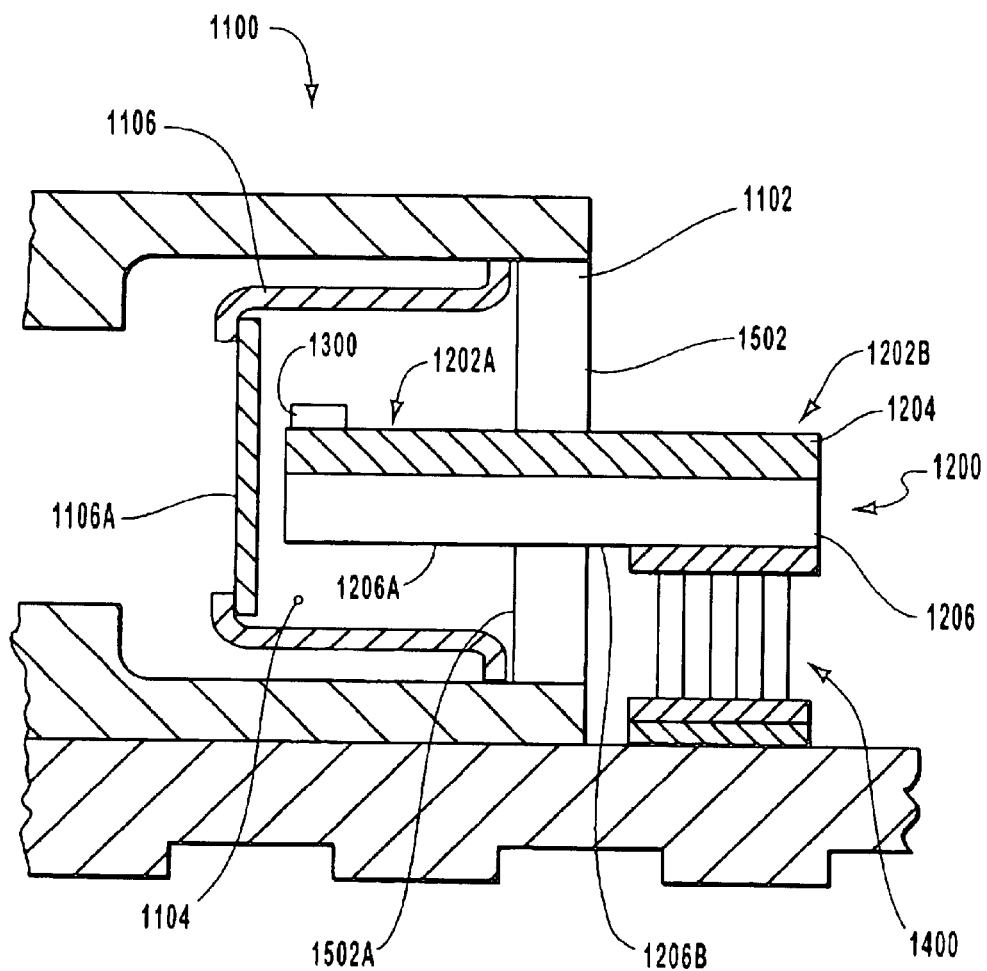
FIG. 4F illustrates various aspects of an alternative platform/TEC configuration where the TEC is located outside the hermetic chamber.

While, as noted earlier in connection with the discussion of FIGS. 4A through 4D, certain effects may be achieved by locating cooling device 900 within hermetic chamber 706, it is nevertheless desirable in some cases to locate the cooling device outside of the hermetic chamber. Aspects of an exemplary embodiment of such a configuration are illustrated in FIG. 4F, where an alternative embodiment of a header assembly is indicated generally at 1100. As the embodiment of the header assembly illustrated in FIG. 4F is similar in many regards to one or more of the embodiments of the header assembly discussed elsewhere herein, the discussion of FIG. 4F will focus primarily on certain selected aspects of the header assembly 1100 illustrated there.

Similar to other embodiments, header assembly 1100 includes a base 1102 having a device side 1102A and a connector side 1102B, through which a platform 1200 passes in a substantially perpendicular orientation. The platform 1200 includes an inside portion 1202A and an outside portion 1202B. One or more electronic devices 1300 are attached to inside portion 1202A of platform 1200 so as to be substantially enclosed within a hermetic chamber 1104 defined by a cap 1106 and base 1102. In the event that electronic device 1300 comprises an optical device, such as a laser, cap 1106 may further comprise an optically transparent portion, or window, 1106A to permit optical signals to be transmitted from and/or received by one or more electronic devices 1300 disposed within hermetic chamber 1104.

With continuing reference to FIG. 4F, platform 1200 further comprises a first feedthru 1204, upon which electronic devices 1300 are mounted, joined to a second feedthru 1206 that includes an inside portion 1206A and an outside portion 1206B. The outside portion 1206B of second feedthru 1206 is, in turn, thermally coupled with a cooling device 1400. In the illustrated embodiment, cooling device 1400 comprises a TEC. However, other types of cooling devices may alternatively be employed.

In operation, heat generated by electronic devices 1300 is transferred, generally by conduction, to second feedthru 1206. The heat is then removed from feedthru 1206 by way of cooling device 1400 which, in some embodiments, comprises a TEC. As in the case of other embodiments, a TEC may also be employed, if desired, to add heat to electronic devices 1300.

Thus positioned and arranged, cooling device 1400 is able not only to implement various thermal effects, such as heat removal or heat addition, with respect to electronic devices 1300 located inside or outside hermetic chamber 1104, but also operates to process passive heat loads, which may be conductive, convective and/or radiative in nature, imposed by various components such as the structural elements of header assembly 1500. As noted herein in the context of the discussion of various other embodiments, variables such as, but not limited to, the geometry, placement, and construction materials of platform 1200 and cooling device 1400 may be adjusted as necessary to suit the requirements of a particular application.

As suggested earlier, at least some embodiments of the cooling device may be usefully employed in the context of a laser control system. Directing attention now to FIG. 5, various aspects of an exemplary embodiment of a laser control system, indicated generally at 2000, are illustrated.

Figure 5:
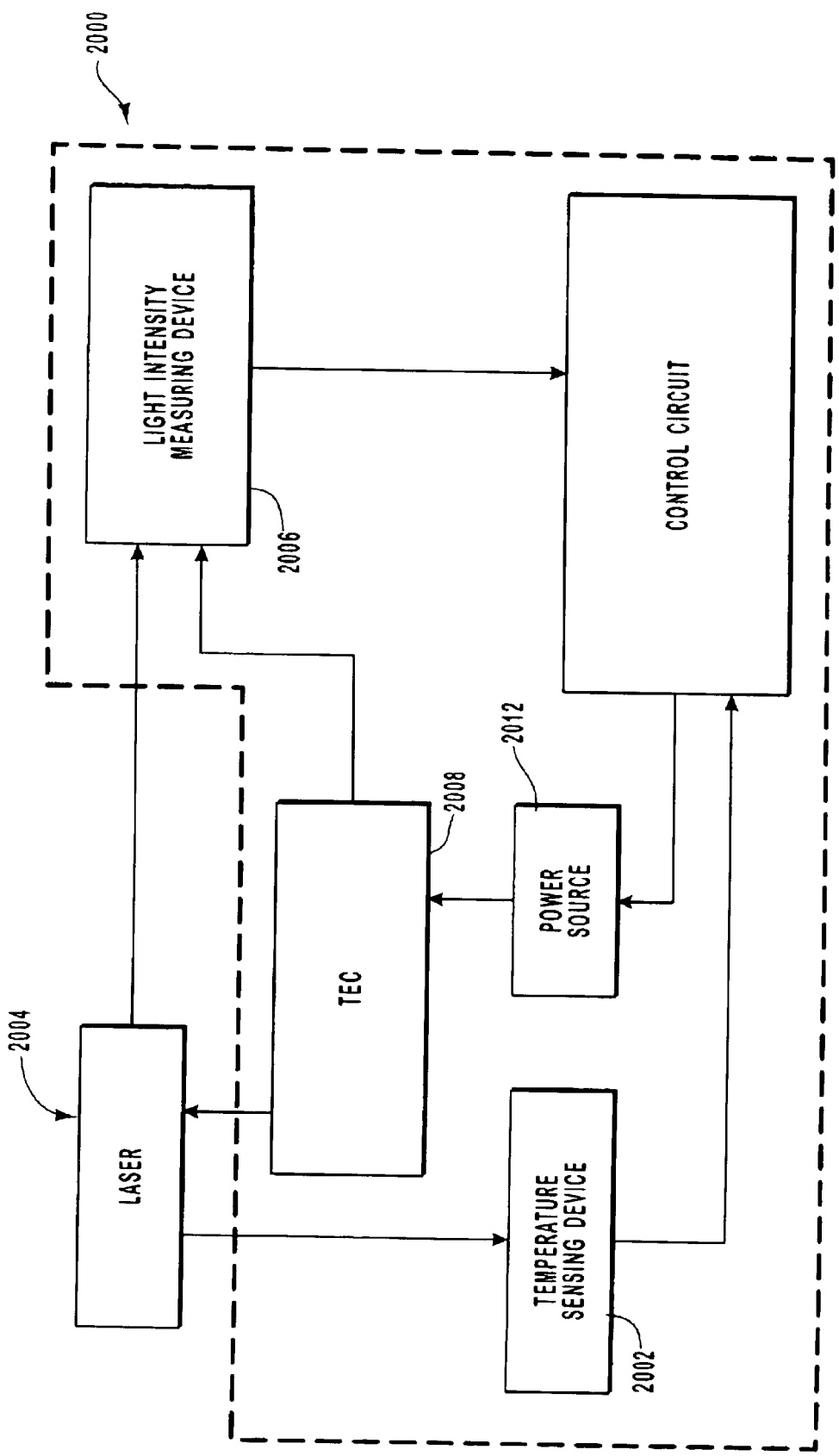
FIG. 5 is a schematic diagram illustrating various aspects of an exemplary embodiments of a laser control system.

As indicated in FIG. 5, laser control system 2000 includes a temperature sensing device 2002, such as a thermistor, which is thermally coupled with a laser 2004, such as a semiconductor laser. Laser control system 2000 further includes a light intensity sensing device 2006, such as a photodiode, that is optically coupled with laser 2004. Further, a TEC 2008 is thermally coupled with laser 2004. In at least one embodiment, such thermal coupling is achieved by mounting laser 2004 directly to a submount of TEC 2008. Laser control system 2000 further includes a control circuit 2010 configured to receive inputs from temperature sensing device 2002 and light intensity sensing device 2006, and to send corresponding control signals to a power source 2012 in communication with TEC 2008.

In general, operation of laser control system 2000 proceeds as hereafter described. In particular, the intensity of the optical signal emitted by laser 2004 is sensed, either directly or indirectly, by light intensity sensing device 2006. Light intensity sensing device 2006 then transmits, from time to time, a corresponding signal to control circuit 2010. In at least some embodiments, the temperature of laser 2004 may be regulated by TEC 2008 so as to achieve wavelength stabilization. This can be achieved by way of control circuit 2010 and power source 2012.

Additionally, temperature sensing device 2002 is positioned and configured to measure the temperature of laser 2004 and transmit, from time to time, a corresponding signal to control circuit 2010. Based upon inputs received from temperature sensing device 2002 and light intensity sensing device 2006, control circuit 2010 is able to implement changes to the temperature of laser 2004 by way of power source 2012 and TEC 2008.

In particular, because TEC 2008 may be configured to add and/or remove heat from laser 2004, laser control system 2000 thus affords the ability to, among other things, change and/or maintain the temperature of laser 2004 as desired or required by a particular application. Thus control circuit 2010 cooperates with TEC 2008 to control both the direction and amount of heat flow with respect to laser 2004. In this way, various operational parameters of the signal emitted by laser 2004 may desirably be adjusted.

That is, embodiments of laser control system 2000 are capable of not only maintaining the temperature of active devices such as laser 2004 below a critical value at which laser 2004 performance begin to degrade and reliability becomes an issue, but embodiments of laser control system 2000 also enable control of the temperature of active devices such as laser 2004 at a given value independent of ambient temperature conditions, so as to achieve certain ends such as, in the case of laser 2004 operation for example, wavelength stabilization.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A header assembly, comprising:
   a base having a first side and a second side; and
   a platform attached to the base and disposed in a predetermined orientation with respect to the base, the platform having an inside portion proximate the first side of the base and an outside portion proximate the second side of the base, and the platform including at least one conductive pathway extending substantially through the platform.

2. The header assembly as recited in claim 1, wherein the base substantially comprises a metallic material.

3. The header assembly as recited in claim 1, wherein when the platform is disposed in the predetermined orientation, the platform is substantially perpendicular to the base.

4. The header assembly as recited in claim 1, wherein the platform extends through at least one side of the base.

5. The header assembly as recited in claim 1, wherein the platform substantially comprises a ceramic material.

6. The header assembly as recited in claim 1, wherein the platform has a thermal conductivity that is different than a thermal conductivity of the base.

7. The header assembly as recited in claim 1, wherein the platform has a thermal conductivity that is relatively higher than a thermal conductivity of the base.

8. The header assembly as recited in claim 1, wherein the at least one conductive pathway of the platform extends through the base.

9. The header assembly as recited in claim 1, wherein the platform substantially comprises one of: aluminum nitride; and, beryllia.

10. The header assembly as recited in claim 1, wherein the platform defines a recessed pocket configured and arranged to at least partly receive an optical component.

11. The header assembly as recited in claim 1, wherein the platform is hermetically sealed to the base.

12. The header assembly as recited in claim 1, further comprising a device mounted to the platform on the first side of the base.

13. The header assembly as recited in claim 12, wherein the device comprises at least one of: an optical transmitter; and, an optical receiver.

14. The header assembly as recited in claim 1, wherein the platform further comprises a connector located on the outside portion of the platform and connected at least indirectly with the at least one conductive pathway.

15. A header assembly, comprising:
   a base having a first side and a second side;
   a platform attached to the base and disposed in a predetermined orientation with respect to the base, the platform having an inside portion proximate the first side of the base and an outside portion proximate the second side of the base, and the platform including at least one conductive pathway extending substantially through the platform; and
   a thermal control element attached at least indirectly to the platform.

16. The header assembly of claim 15, wherein the thermal control element is mounted at least indirectly to the inside portion of the platform.

17. The header assembly of claim 15, wherein the thermal control element comprises a thermoelectric cooler.

18. The header assembly as recited in claim 15, wherein the base substantially comprises a metallic material.

19. The header assembly as recited in claim 15, wherein when the platform is disposed in the predetermined orientation, the platform is substantially perpendicular to the base.

20. The header assembly as recited in claim 15, wherein the platform extends through at least one side of the base.

21. The header assembly as recited in claim 15, wherein the platform substantially comprises a ceramic material.

22. The header assembly as recited in claim 15, wherein the thermal control element is configured to facilitate transfer of heat to, and from, an optical device mounted at least indirectly to the platform.

23. The header assembly as recited in claim 15, further comprising at least one optical device mounted at least indirectly to the platform, the optical device being arranged for thermal communication with the thermal control element.

24. The header assembly as recited in claim 15, further comprising a cap that cooperates with the base to define a hermetic chamber substantially enclosing the inside portion of the platform and the thermal control element.

25. The header assembly as recited in claim 15, wherein the platform further comprises a connector located on the outside portion of the platform and connected at least indirectly with the at least one conductive pathway.

26. A header assembly, comprising:
   a base substantially having a device side and a connector side;
   a platform attached to the base and disposed in a predetermined orientation with respect to the base, the platform having an inside portion proximate the first side of the base and an outside portion proximate the second side of the base, and the platform including at least one conductive pathway extending substantially through the platform;
   a device mounted indirectly to the inside portion of the platform; and
   means for transferring heat, the means for transferring heat being thermally coupled with the device.

27. The header assembly as recited in claim 26, wherein the means for transferring heat facilitates removal of heat from the device.

28. The header assembly as recited in claim 26, wherein the means for transferring heat facilitates the transfer of heat to the device.

29. The header assembly as recited in claim 26, wherein the means for transferring heat facilitates positioning of the device.

30. The header assembly as recited in claim 26, wherein the means for transferring heat aids in controlling performance of the device.

31. The header assembly as recited in claim 26, wherein the device comprises at least one of: an optical transmitter; and, an optical receiver.

32. An optoelectronic device, comprising:
   a header assembly, comprising:
      a base having a first side and a second side;
      a platform attached to the base and disposed in a predetermined orientation with respect to the base, the platform having an inside portion proximate the first side of the base and an outside portion proximate the second side of the base, and the platform including at least one conductive pathway extending substantially through the platform; and
      at least one optical device at least indirectly attached to the platform; and
   a printed circuit board electrically connected with the header assembly.

33. The optoelectronic device as recited in claim 32, wherein the electrical connection between the printed circuit board and the header assembly is implemented by way of a flex circuit in electrical communication with the printed circuit board and with the platform.

34. The optoelectronic device as recited in claim 32, wherein the at least one optical device comprises at least one of: an optical transmitter; and, an optical receiver.

35. The optoelectronic device as recited in claim 32, wherein the base of the header assembly substantially comprises a metallic material.

36. The optoelectronic device as recited in claim 32, wherein when the platform of the header assembly is disposed in the predetermined orientation, the platform is substantially perpendicular to the base.

37. The optoelectronic device as recited in claim 32, wherein the platform of the header assembly extends through at least one side of the base.

38. The optoelectronic device as recited in claim 32, wherein the platform of the header assembly substantially comprises a ceramic material.

39. The optoelectronic device as recited in claim 32, wherein the platform of the header assembly further comprises a connector located on the outside portion of the platform and connected at least indirectly with the at least one conductive pathway and with the printed circuit board.

40. The optoelectronic device as recited in claim 32, wherein the platform has a thermal conductivity that is relatively higher than a thermal conductivity of the base.

41. The optoelectronic device as recited in claim 32, wherein the at least one conductive pathway of the platform extends through the base.

42. The optoelectronic device as recited in claim 32, further comprising a thermal control element attached at least indirectly to the platform and arranged for thermal communication with the at least one optical device.

* * * * *